(12) United States Patent
Brown et al.

(10) Patent No.: US 11,189,409 B2
(45) Date of Patent: Nov. 30, 2021

(54) ELECTRONIC SUBSTRATES HAVING EMBEDDED DIELECTRIC MAGNETIC MATERIAL TO FORM INDUCTORS

(71) Applicant: Intel Corporation, Santa Clara, CA (US)

(72) Inventors: Andrew J. Brown, Chandler, AZ (US); Prithwish Chatterjee, Tempe, AZ (US); Lauren A. Link, Chandler, AZ (US); Sai Vadlamani, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 822 days.

(21) Appl. No.: 15/856,547

(22) Filed: Dec. 28, 2017

(65) Prior Publication Data
US 2019/0206597 A1 Jul. 4, 2019

(51) Int. Cl.
*H01L 21/48* (2006.01)
*H01F 1/20* (2006.01)
(Continued)

(52) U.S. Cl.
CPC ................ *H01F 1/20* (2013.01); *H01F 1/28* (2013.01); *H01F 1/37* (2013.01); *H01F 41/02* (2013.01);
(Continued)

(58) Field of Classification Search
CPC ..... H01F 1/20; H01F 1/37; H01F 1/28; H01F 41/02; H01F 27/2804; H01F 2017/002; H01F 17/0013; H01L 23/49838; H01L 23/49894; H01L 23/49827; H01L 21/481; H01L 21/486; H01L 24/13; H01L 2224/0401; H01L 2224/48227; H01L 24/81; H01L 2224/13111;
(Continued)

(56) References Cited

U.S. PATENT DOCUMENTS 6,996,892 B1 * 2/2006 Dening ............... H01F 17/0013
29/602.1
2007/0257761 A1 * 11/2007 Mano .................... H01F 41/046
336/200

(Continued)

OTHER PUBLICATIONS

Bekker, et al., "Development and optimisation of thin soft ferromagnetic Fe—Co—Ta—N and Fe—Co—Al—N films with in-plane uniaxial anisotropy for HF applications", Journal of Magnetism and Magnetic Materials 296; 2006; pp. 37-45.

(Continued)

*Primary Examiner* — Steven T Sawyer
(74) *Attorney, Agent, or Firm* — Essential Patents Group, LLP.

(57) ABSTRACT

An inductor may be fabricated comprising a magnetic material layer and an electrically conductive via or trace extending through the magnetic material layer, wherein the magnetic material layer comprises dielectric magnetic filler particles within a carrier material. Further embodiments may include incorporating the inductor of the present description into an electronic substrate and may further include an integrated circuit device attached to the electronic substrate and the electronic substrate may further be attached to a board, such as a motherboard.

16 Claims, 5 Drawing Sheets

(51) Int. Cl.
*H01L 23/498* (2006.01)
*H01F 41/02* (2006.01)
*H05K 1/18* (2006.01)
*H01F 1/37* (2006.01)
*H01F 1/28* (2006.01)
*H01L 23/00* (2006.01)

(52) U.S. Cl.
CPC .......... *H01L 21/481* (2013.01); *H01L 21/486* (2013.01); *H01L 23/49827* (2013.01); *H01L 23/49838* (2013.01); *H01L 23/49894* (2013.01); *H05K 1/181* (2013.01); *H01L 23/49816* (2013.01); *H01L 24/13* (2013.01); *H01L 24/16* (2013.01); *H01L 24/48* (2013.01); *H01L 24/81* (2013.01); *H01L 2224/0401* (2013.01); *H01L 2224/13111* (2013.01); *H01L 2224/13116* (2013.01); *H01L 2224/16227* (2013.01); *H01L 2224/16265* (2013.01); *H01L 2224/48227* (2013.01); *H01L 2224/81203* (2013.01); *H01L 2224/81207* (2013.01); *H01L 2224/81815* (2013.01); *H01L 2924/15311* (2013.01); *H01L 2924/19011* (2013.01); *H01L 2924/19042* (2013.01)

(58) Field of Classification Search
CPC ........... H01L 2224/81203; H01L 24/48; H01L 2924/15311; H01L 2224/81815; H01L 2224/13116; H01L 2224/81207; H01L 2924/19011; H01L 23/49816; H01L 24/16; H01L 2224/16227; H01L 2224/16265; H01L 2924/19042; H01L 23/49822; H01L 23/5227; H01L 21/76838; H01L 23/5384; H01L 23/645; H01L 28/10; H01L 21/4857; H05K 1/181; H05K 2201/0187; H05K 1/165; H05K 2201/0215; H05K 2201/086; H05K 1/115; H05K 1/0233

See application file for complete search history.

(56) References Cited

U.S. PATENT DOCUMENTS

| 2014/0145812 A1* | 5/2014 | Lee | H01F 41/041 336/200 |
| 2014/0159851 A1* | 6/2014 | Mano | H01F 17/0013 336/200 |
| 2015/0213946 A1* | 7/2015 | Mano | H01F 17/04 336/200 |

OTHER PUBLICATIONS

Nguyen, et al., "Novel nanostructure and magnetic properties of Co—Fe—Hf—O films", Nanotechnology; vol. 18; 155705; 2007; 7 pages.

Wang, et al., Nature; vol. 407; Macmillan Magazines Ltd.; Sep. 14, 2000; pp. 150-151.

* cited by examiner

ELECTRONIC SUBSTRATES HAVING EMBEDDED DIELECTRIC MAGNETIC MATERIAL TO FORM INDUCTORS

TECHNICAL FIELD

Embodiments of the present description generally relate to the field of electronic substrates and, more particularly, to the integration of dielectric magnetic materials into the electronic substrates to form inductors.

BACKGROUND ART

The integrated circuit industry is continually striving to produced ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize the current in the integrated circuit devices. As will be understood to those skilled in the art, inductors are passive electrical components that store energy in a magnetic field generated by a magnetic material and are generally standalone components that are electrically attached to the integrated circuit devices. In order to produced faster and smaller integrated circuit devices, these inductors may be embedded in electronic substrates, wherein the electronic substrates are used to route electrical signals for active and passive components in the integrated circuit devices. However, embedding inductors may require the use of magnetic films, pastes, and inks formed from magnetic filler particles disposed in a polymer carrier. The magnetic filler particles are generally iron-based magnetic particles, such as iron oxides, which are electrically conductive. As these magnetic filler particles are conductive, they may interfere with signal integrity and may promote crosstalk and shorts. The conductivity of these magnetic filler particles may be reduced by coating them with a non-conductive material. However, although such coating may reduce the risk of signal disruption, it may also diminish the magnetic properties of the magnetic filler particles. Furthermore, it may be difficult to fully and evenly coat the magnetic filler particles with the non-conductive material. Moreover, such non-conductive material coatings may also be chemically and thermally unstable, and may decompose during processing steps used to fabricate the electronic substrates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
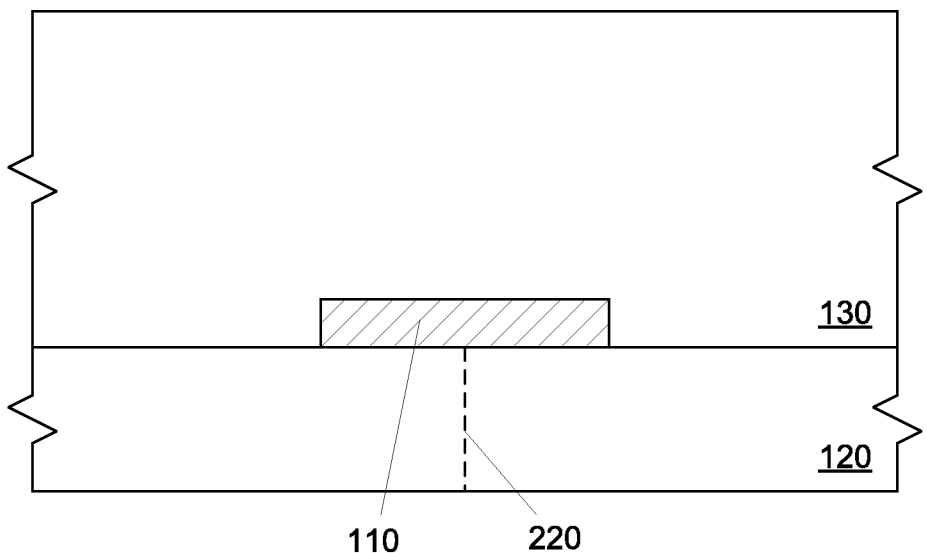
FIGS. 1-4 illustrate side cross-sectional views of a method of forming an inductor having a dielectric magnetic material layer, according to various embodiments of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include an inductor having a magnetic material layer, comprising dielectric magnetic filler particles within a carrier material, and an electrically conductive via extending through the magnetic material layer. Further embodiments may include incorporating the inductor of the present description into an electronic substrate and may further include an integrated circuit device attached to the electronic substrate and the electronic substrate may further be attached to a board, such as a motherboard.

Figure 2:
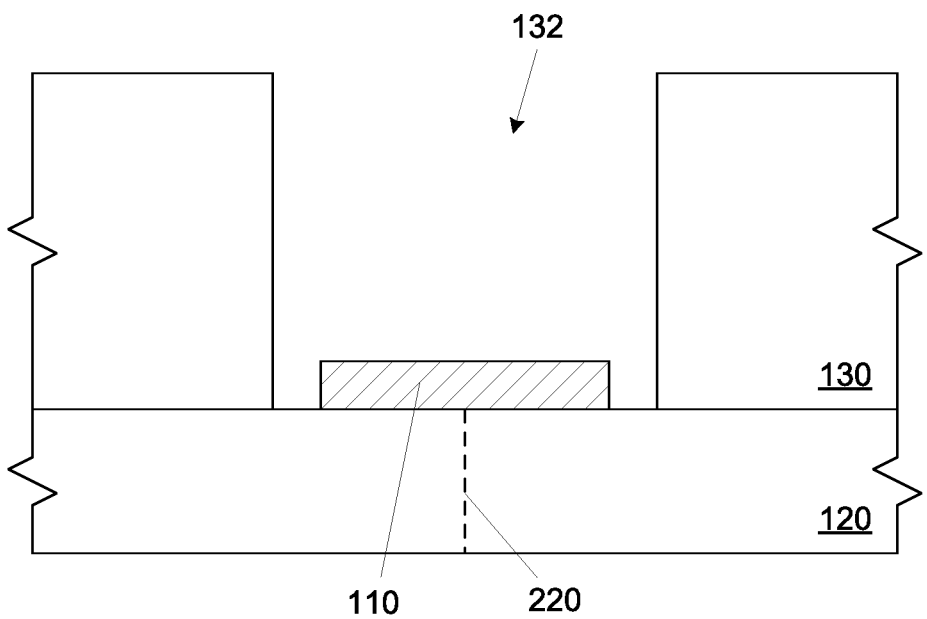

As shown in FIG. 1, at least one contact 110 may be formed on a first dielectric layer 120, by any technique known in the art. A second dielectric layer 130 may be formed on the first dielectric layer 120 and the at least one contact 110, such as by lamination. As shown in FIG. 2, at least one opening 132 may be formed through the second dielectric layer 130 to expose the at least one contact 110.

Figure 3:
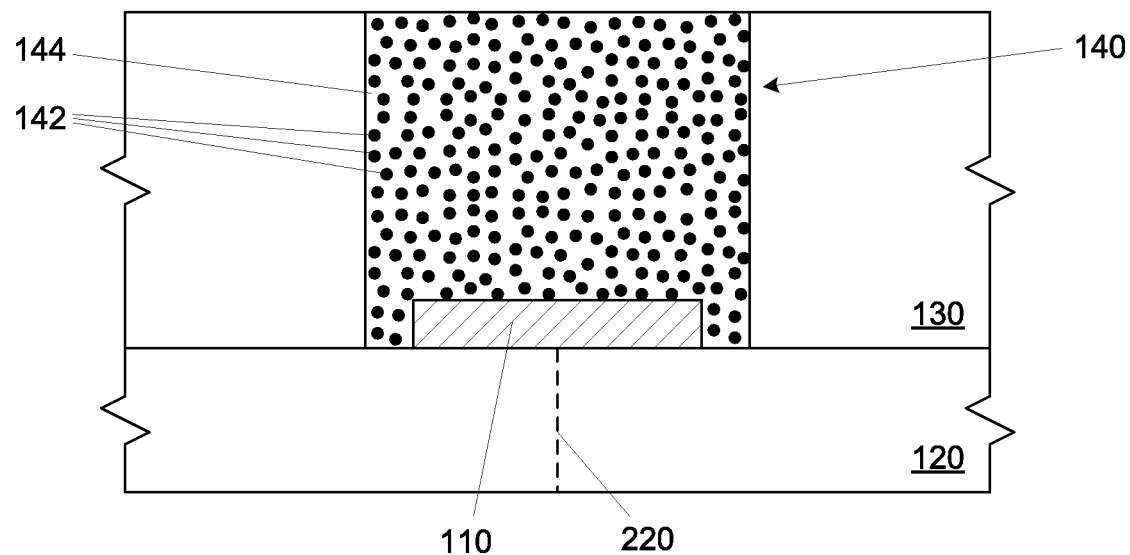

As shown in FIG. 3, a magnetic material layer 140 may be formed by disposing a magnetic material into at least one of the second dielectric openings 132 (see FIG. 2). The magnetic material layer 140 may comprise dielectric magnetic filler particles 142 within a carrier material 144. The term "dielectric magnetic filler particle" is defined to mean any appropriate filler particles having a resistivity of greater than about 1e-7 ohm meters, an initial permeability of greater than about 200, and a coercivity of greater than about 0.05 milliTeslas. In one embodiment, the dielectric magnetic filler particles 142 may have a resistivity of between about 1e-7 and 1e-4 ohm meters. In a specific embodiment, the dielectric magnetic filler particle may have a resistivity of greater than about 5.5e-7 ohm meters. In another embodiment, the dielectric magnetic filler particles 142 may have an initial permeability of between about 200 and 4600. In still another embodiment, the dielectric magnetic filler particles 142 may have a coercivity of between about 0.05 and 10 milliTeslas. In another embodiment, the dielectric magnetic filler particles 142 comprise between about 50% to 85% by weight of the magnetic material layer 140. In a further embodiment, the dielectric magnetic filler particles 142 may have an average particle diameter of between about 0.05 and 50 microns. In still a further embodiment, the carrier material 144 may comprise a polymer resin, wherein the polymer resin may comprise epoxy.

The dielectric magnetic filler particles 142 may be any appropriate material. In one embodiment the dielectric magnetic filler particles 142 by comprise iron-based soft magnetic filler particles. In a specific embodiment, the iron-based soft magnetic filler particles may comprise iron/silicon alloys, nickel/iron alloys, and soft ferrites.

In another embodiment, the dielectric magnetic filler particles 142 may comprise an iron/cobalt/aluminum alloy. In a specific embodiment thereof, the iron/cobalt/aluminum alloy may comprise $Fe_{49}Co_{36}Al_{15}$.

In a further embodiment, the dielectric magnetic filler particles 142 may comprise a cobalt/iron/hafnium/oxygen alloy. In a specific embodiment thereof, the cobalt/iron/hafnium/oxygen alloy may comprise $Co_{10.78}Fe_{60.59}Hf_{7.32}O_{21.3}$.

In still a further embodiment, the dielectric magnetic filler particles 142 may comprise an iron/hafnium/oxygen alloy. In a specific embodiment thereof, the iron/hafnium/oxygen alloy may comprise $Fe_{62}Hf_{11}O_{27}$.

In still a further embodiment, the dielectric magnetic filler particles 142 may comprise an iron/aluminum/oxygen alloy. In a specific embodiment thereof, the iron/aluminum/oxygen alloy may comprise $Fe_{88}Al_{3.5}O_8$.

Figure 4:
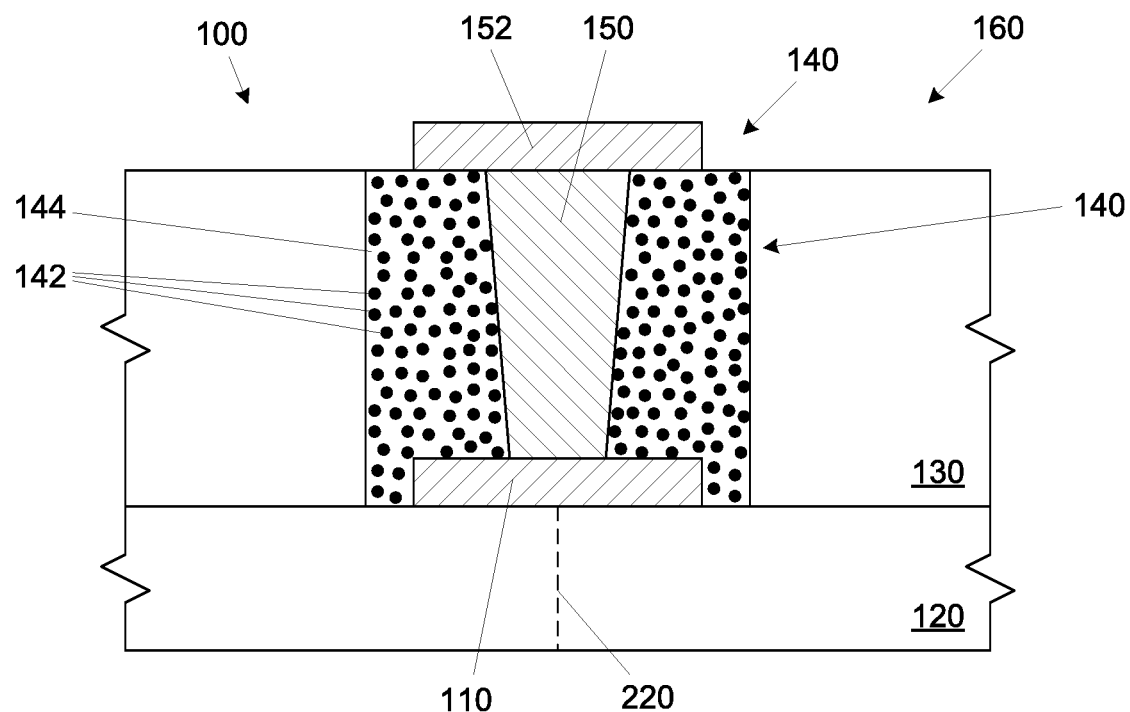

As shown in FIG. 4, an inductor conductive via 150 may be formed through the magnetic material layer 140 and an inductor contact 152 may be formed on the magnetic material layer 140 in electrical contact with the inductor conductive via 150 to form at least a portion of an inductor 160, as well as at least a portion of an electronic substrate 100.

Figure 5:
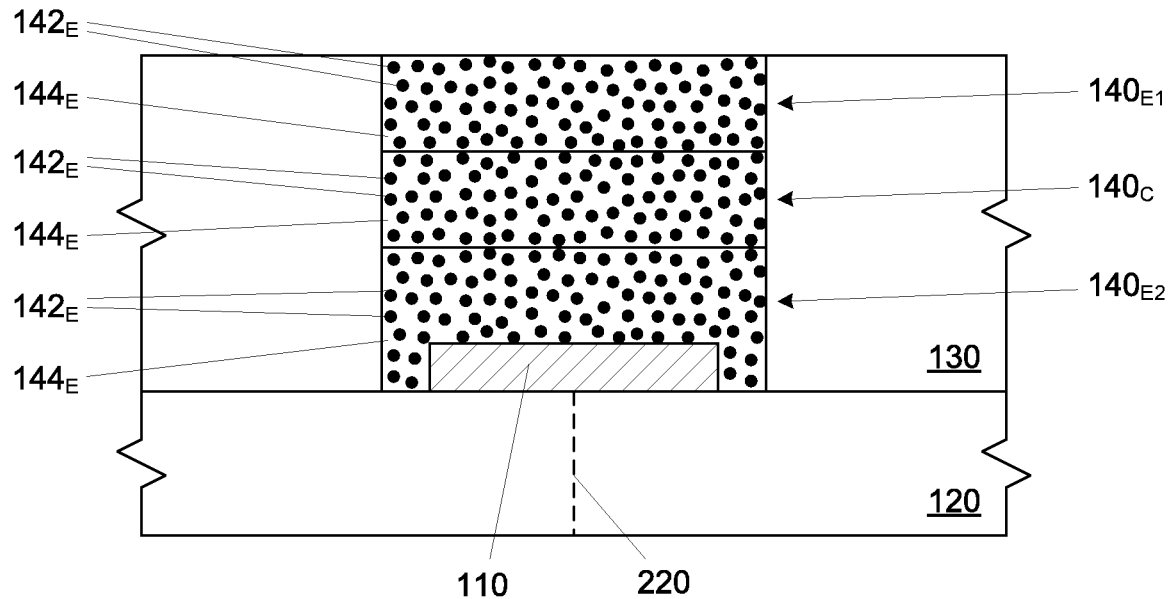
FIGS. 5 and 6 illustrates side cross-sectional views of a method of forming an inductor having a dielectric magnetic material layer comprising multiple layers, according to one embodiment of the present description.

As shown in FIG. 5, the magnetic material layer 140 may be formed as a layered stack, rather than a single layer. In one embodiment, magnetic layer 140 may comprise a center layer $140_C$ comprising iron/cobalt/nickel alloy filler particles $142_C$ in a carrier material $144_C$, which is disposed between a pair of exterior layers $140_{E1}$ and $140_{E2}$, wherein the exterior layers $140_{E1}$ and $140_{E2}$ may comprise nickel/iron alloy particles $142_E$ in a carrier material $144_E$. In one embodiment, the iron/cobalt/nickel alloy filler particles $142_C$ of the center layer $140_C$ comprise $(Fe_{0.7}Co_{0.3})_{0.95}Ni_{0.05}$. In another embodiment, nickel iron alloy filler particles $142_E$ of the pair of exterior layers $140_{E1}$ and $140_{E2}$ comprise $Ni_{0.81}Fe_{0.19}$.

Figure 6:
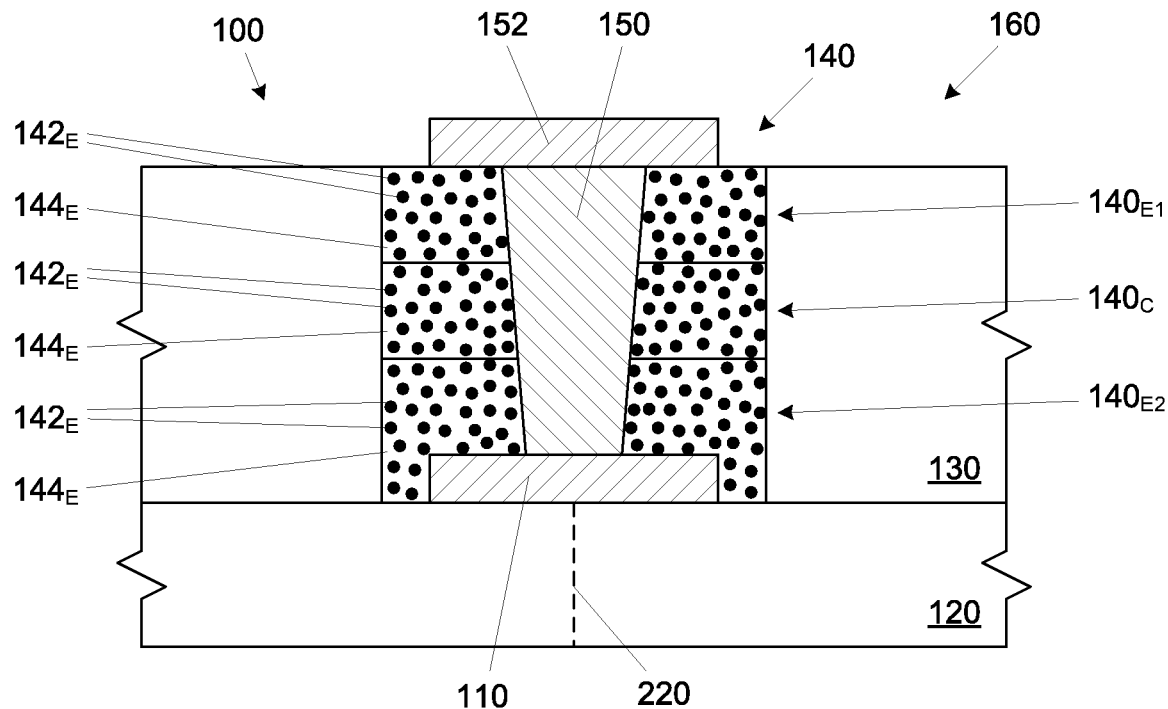

As shown in FIG. 6, an inductor conductive via 150 may be formed through the magnetic material layer 140, i.e. through the center layer $140_C$ and the pair of exterior layer $140_{E1}$ and $140_{E2}$, and an inductor contact 152 may be formed on the magnetic material layer 140 in electrical contact with the inductor conductive via 150.

Figure 7:
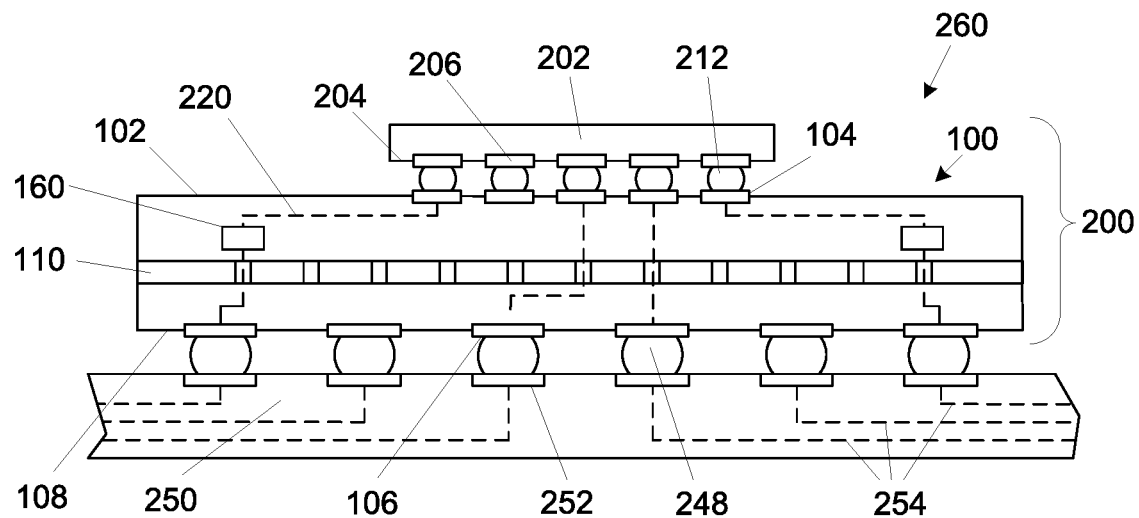
FIG. 7 illustrates a side cross-sectional view of an inductor embedded in an electronic substrate, wherein the electronic substrate is electrically attached to an electronic board and wherein an integrated circuit device is electrically attached to the electronic substrate, according to an embodiment of the present description.

As shown in FIG. 7, in one embodiment of the present description, the electronic substrate 100 of FIG. 6 may have an integrated circuit device 202, such as a microprocessor, a chipset, a graphics device, a wireless device, a memory device, an application specific integrated circuit, or the like, attached thereto to form an electronic package 200. The integrated circuit device 202 may be attached to a first surface 102 of the electronic substrate 100 through a plurality of interconnects 212. The device-to-substrate interconnects 212 may extend between bond pads 206 on a first surface 204 of the integrated circuit device 202 and substantially mirror-image bond pads 104 on the electronic substrate first surface 102. The integrated circuit device bond pads 206 may be in electrical communication with integrated circuitry (not shown) within the integrated circuit device 202.

The electronic package 200 may be attached to an electronic board 250, such as a motherboard, through a plurality of interconnects 248 to form an electronic structure 260. The package-to-board interconnects 248 may extend between bond pads 106 on a second surface 108 of the electronic substrate 100 and substantially mirror-image bond pads 252 on the electronic board 250. The bond pads 252 of the electronic board 250 may be in electrical communication with board communication routes (illustrated as dashed lines 254), which may be in electrical communication with components (not shown) external to the electronic package 200.

The electronic substrate bond pads 106 may be in electrical communication with electrical communication routes (illustrated as dashed lines 220 within the electronic substrate 100). These electrical communication routes 220 may form electronic contact between the electronic board 250 and the integrated circuit device 202, which may include electrical contact with the inductor 160 within the electronic substrate 100.

When solder balls or bumps are used to form the device-to-substrate interconnects 212 and/or the package-to-board interconnects 248, the solder may be any appropriate material, including, but not limited to, lead/tin alloys and high tin content alloys (e.g. about 90% or more tin), and similar alloys. The solder may be reflowed, either by heat, pressure, and/or sonic energy. Although the device-to-substrate interconnects 212 are shown as reflowable solder bumps or balls, they may be pins, lands, or wire bonds, as known in the art.

The electrical communication routes 220 may be made of multiple layers of conductive traces, such as copper or aluminum, built up on and through dielectric layers, which are laminated on either side of a substrate core 110. The board communication routes 254 may be made of multiple layers of conductive traces, such as copper or aluminum, built up on and through dielectric layers, as will be understood to those skilled in the art.

Figure 8:
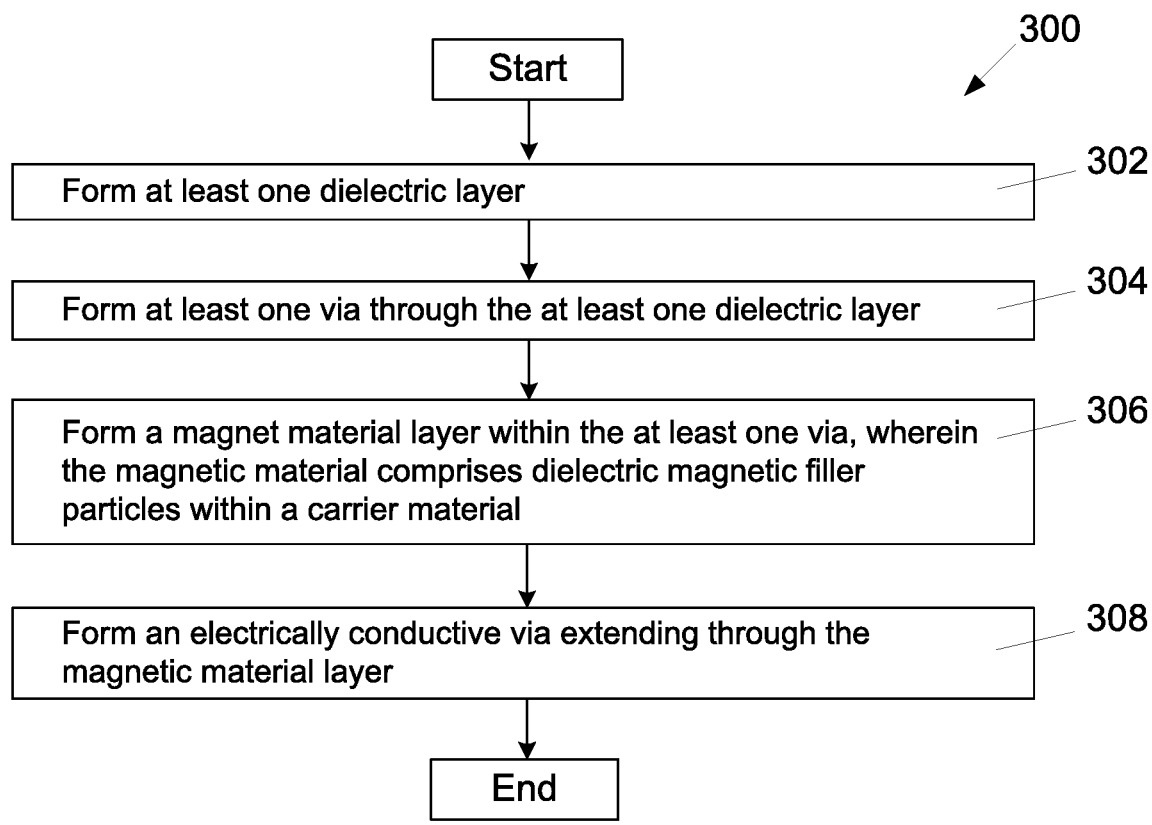
FIG. 8 is a flow chart of a process of fabricating an integrated circuit package, according to an embodiment of the present description.

FIG. 8 is a flow chart of a process 300 of fabricating an electronic structure, according to the various embodiments of the present description. As set forth in block 302, a dielectric layer may be formed. At least one via may be formed through the dielectric layer, as set forth in block 304. As set forth in block 306, a magnetic material layer comprising a dielectric material filler material disposed in a carrier material may be formed within the at least one via. An electrically conductive via may be formed extending through the magnetic material layer, as set forth in block 308.

Figure 9:
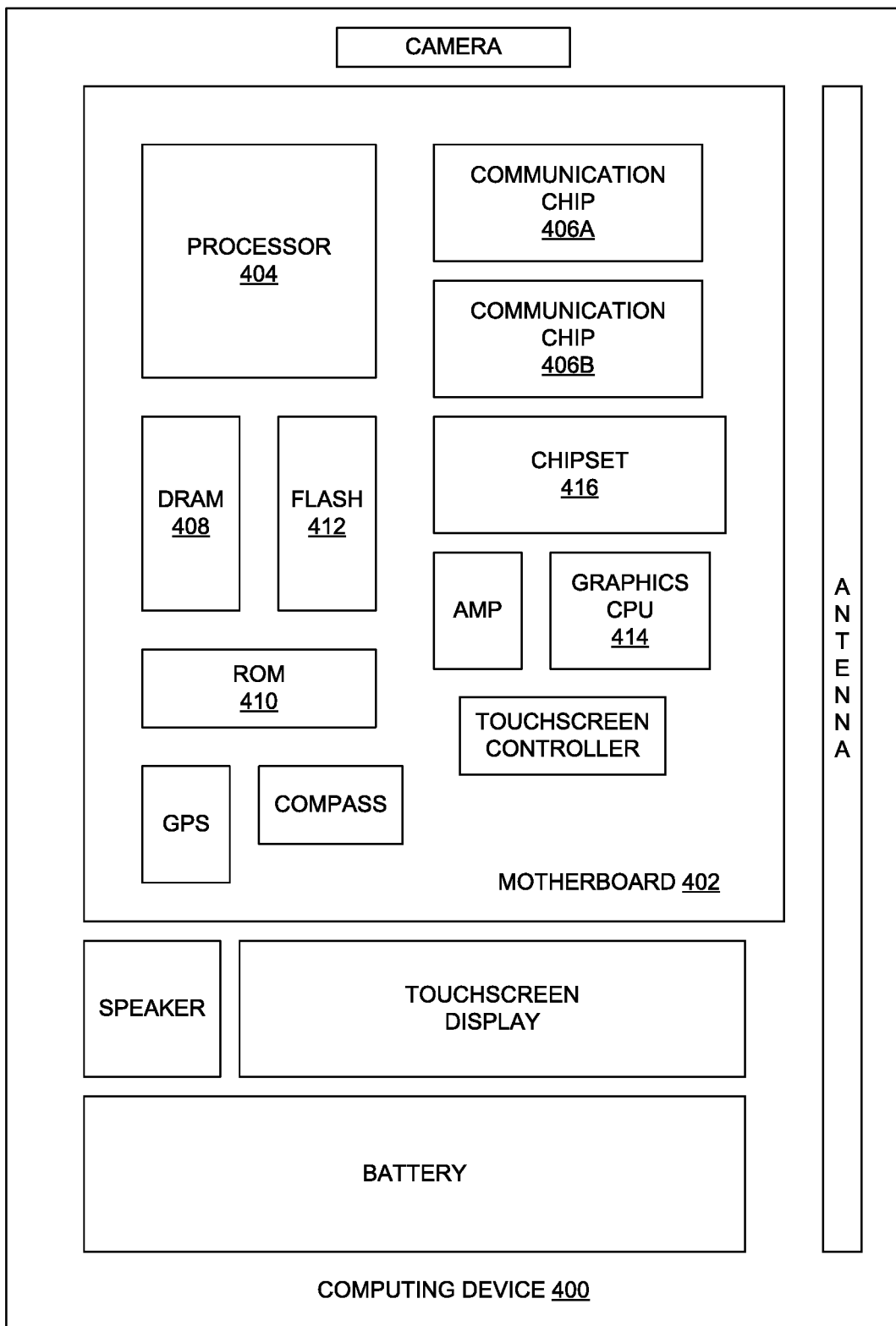
FIG. 9 illustrates an electronic system/device, according to one implementation of the present description.

FIG. 9 illustrates an electronic system or computing device 400 in accordance with one implementation of the present description. The computing device 400 may house a board 402. The board 402 may include a number of integrated circuit components attached thereto, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others The term "processor" may refer to any device or portion of a device that processes electronic data from registers and/or memory to transform that electronic data into other electronic data that may be stored in registers and/or memory.

Any of the integrated circuit components within the computing device 400 may include an inductor embedded in an electronic substrate, wherein the electronic substrate has at least one dielectric layer having a via formed therethrough and wherein the inductor comprises a magnetic material layer disposed within the via of the dielectric layer and an electrically conductive via extending through the magnetic material layer, wherein the magnetic material layer comprises a dielectric magnetic filler material within a carrier material.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other integrated circuit device and assembly applications, as will be understood to those skilled in the art.

The following examples pertain to further embodiments, wherein Example 1 is an inductor comprising a magnetic material layer and an electrically conductive via extending through the magnetic material layer, wherein the magnetic material layer comprises dielectric magnetic filler particles within a carrier material.

In Example 2, the subject matter of Example 1 can optionally include the dielectric magnetic filler particles having a resistivity of greater than about 5.5e-7 ohm meters.

In Example 3, the subject matter of Example 1 can optionally include the dielectric magnetic filler particles comprising between about 50% to 85% by weight of the magnetic material layer.

In Example 4, the subject matter of any of Examples 1 to 3 can optionally include the dielectric magnetic filler particles being selected from the group comprising iron-base soft magnetic fillers, iron/cobalt/aluminum alloys, cobalt/iron/hafnium/oxygen alloys, iron/hafnium/oxygen alloy, and iron/aluminum/oxygen alloy.

In Example 5, the subject matter of Example 1 can optionally include the magnetic material layer comprising a layered stack.

In Example 6, the subject matter of Example 5 can optionally include the layered stack comprising a center layer comprising iron/cobalt/nickel alloy filler particles in a carrier material between a pair of exterior layers comprising nickel/iron alloy particles in a carrier material.

In Example 7, the subject matter of Example 6 can optionally include the iron/cobalt/nickel alloy filler particles comprising $(Fe_{0.7}Co_{0.3})_{0.95}Ni_{0.05}$.

In Example 8, the subject matter of Example 6 can optionally include the nickel iron alloy filler particles comprising $Ni_{0.81}Fe_{0.19}$.

In Example 9, the subject matter of any of Examples 1 to 3 can optionally include the carrier material comprises a polymer resin.

In Example 10, the subject matter of Example 9 can optionally include the polymer resin comprising epoxy.

The following examples pertain to further embodiments, wherein Example 11 is an electronic system, comprising a board and an electronic package attached to the board, wherein the electronic package comprises an electronic substrate having at least one dielectric layer, an inductor embedded in the electronic substrate, wherein the inductor comprising a magnetic material layer and an electrically conductive via extending through the magnetic material layer, wherein the magnetic material layer comprises dielectric magnetic filler particles within a carrier material.

In Example 12, the subject matter of Example 11 can optionally include the dielectric magnetic filler particles having a resistivity of greater than about 5.5e-7 ohm meters.

In Example 13, the subject matter of Example 11 can optionally include the dielectric magnetic filler particles comprising between about 50% to 85% by weight of the magnetic material layer.

In Example 14, the subject matter of any of Examples 11 to 13 can optionally include the dielectric magnetic filler particles being selected from the group comprising iron-base soft magnetic fillers, iron/cobalt/aluminum alloys, cobalt/iron/hafnium/oxygen alloys, iron/hafnium/oxygen alloy, and iron/aluminum/oxygen alloy.

In Example 15, the subject matter of Example 11 an optionally include the magnetic material layer comprising a layered stack.

In Example 16, the subject matter of Example 15 can optionally include the layered stack comprising a center layer comprising iron/cobalt/nickel alloy filler particles in a carrier material between a pair of exterior layers comprising nickel/iron alloy particles in a carrier material.

In Example 17, the subject matter of Example 16 can optionally include the iron/cobalt/nickel alloy filler particles comprising $(Fe_{0.7}Co_{0.3})_{0.95}Ni_{0.05}$.

In Example 18, the subject matter of Example 16 can optionally include the nickel iron alloy filler particles comprising $Ni_{0.81}Fe_{0.19}$.

In Example 19, the subject matter of any of Examples 11 to 13 can optionally include the carrier material comprises a polymer resin.

In Example 20, the subject matter of Example 19 can optionally include the polymer resin comprising epoxy.

In Example 21, the subject matter of Example 11 can optionally include a substrate core.

The following examples pertain to further embodiments, wherein Example 22 is a method of forming an electronic structure, comprising forming at least one dielectric layer; forming at least one via through the at least one dielectric layer; forming a magnetic material layer within the at least one via, wherein the magnetic material layer comprises dielectric magnetic filler particles within a carrier material; and forming an electrically conductive via extending through the magnetic material layer.

In Example 23, the subject matter of Example 22 can optionally include the dielectric magnetic filler particles having a resistivity of greater than about 5.5e-7 ohm meters.

In Example 24, the subject matter of Example 22 can optionally include the dielectric magnetic filler particles comprising between about 50% to 85% by weight of the magnetic material layer.

In Example 25, the subject matter of any of Examples 22 to 24 can optionally include the dielectric magnetic filler particles being selected from the group comprising iron-base soft magnetic fillers, iron/cobalt/aluminum alloys, cobalt/iron/hafnium/oxygen alloys, iron/hafnium/oxygen alloy, and iron/aluminum/oxygen alloy.

In Example 26, the subject matter of Example 22 can optionally include forming the magnetic material layer comprising forming a layered stack.

In Example 27, the subject matter of Example 26 can optionally include forming the layered stack comprising forming a center layer comprising iron/cobalt/nickel alloy filler particles in a carrier material between a pair of exterior layers comprising nickel/iron alloy particles in a carrier material.

In Example 28, the subject matter of Example 27 can optionally include the iron/cobalt/nickel alloy filler particles comprising $(Fe_{0.7}Co_{0.3})_{0.95}Ni_{0.05}$.

In Example 29, the subject matter of Example 27 can optionally include the nickel iron alloy filler particles comprising $Ni_{0.81}Fe_{0.19}$.

In Example 30, the subject matter of any of Examples 22 to 24 can optionally include the carrier material comprises a polymer resin.

In Example 31, the subject matter of Example 30 can optionally include the polymer resin comprising epoxy.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An inductor comprising a magnetic material layer and an electrically conductive via extending through the magnetic material layer, wherein the magnetic material layer comprises a layered stack comprising a center layer comprising iron/cobalt/nickel alloy dielectric magnetic filler particles in a carrier material between a pair of exterior layers comprising nickel/iron alloy dielectric magnetic filler particles in a carrier material.

2. The inductor of claim 1, wherein the iron/cobalt/nickel alloy dielectric magnetic filler particles and the nickel/iron alloy dielectric magnetic filler particles have a resistivity of greater than about 5.5e-7 ohm meters.

3. The inductor of claim 1, wherein the iron/cobalt/nickel alloy filler particles comprise $(Fe_{0.7}Co_{0.3})_{0.95}Ni_{0.05}$.

4. The inductor of claim 1, wherein the nickel iron alloy filler particles comprise $Ni_{0.81}Fe_{0.19}$.

5. The inductor of claim 1, wherein at least one of the carrier material of the center layer and the carrier material of one of the pair of exterior layers comprises a polymer resin.

6. An electronic system, comprising:
   a board; and
   an electronic package attached to the board, wherein the electronic package comprises:
   an electronic substrate having at least one dielectric layer;
   an inductor embedded in the electronic substrate, wherein the inductor comprises a magnetic material layer and an electrically conductive via extending through the magnetic material layer, wherein the magnetic material layer comprises a layered stack comprising a center layer comprising iron/cobalt/nickel alloy dielectric magnetic filler particles in a carrier material between a pair of exterior layers comprising nickel/iron alloy dielectric magnetic filler particles in a carrier material.

7. The electronic system of claim 6, wherein the iron/cobalt/nickel alloy dielectric magnetic filler particles and the nickel/iron alloy dielectric magnetic filler particles have a resistivity of greater than about 5.5e-7 ohm meters.

8. The electronic system of claim 6, wherein the iron/cobalt/nickel alloy filler particles comprise $(Fe_{0.7}Co_{0.3})_{0.95}Ni_{0.05}$.

9. The electronic system of claim 6, wherein the nickel iron alloy filler particles comprise $Ni_{0.81}Fe_{0.19}$.

10. The electronic system of claim 6, wherein at least one of the carrier material of the center layer and the carrier material of the pair of exterior layers comprises a polymer resin.

11. The electronic system of claim 6, wherein the electronic substrate includes a substrate core.

12. A method of fabricating an electronic structure, comprising:
   forming at least one dielectric layer;
   forming at least one via through the at least one dielectric layer;
   forming a magnetic material layer within the at least one via, wherein the magnetic material layer comprises a layered stack comprising a center layer comprising iron/cobalt/nickel alloy dielectric magnetic filler particles in a carrier material between a pair of exterior layers comprising nickel/iron alloy dielectric magnetic filler particles in a carrier material; and
   forming an electrically conductive via extending through the magnetic material layer.

13. The method of claim 12, wherein the iron/cobalt/nickel alloy dielectric magnetic filler particles and the nickel/iron alloy dielectric magnetic filler particles have a resistivity of greater than about 5.5e-7 ohm meters.

14. The method of claim 12, wherein the iron/cobalt/nickel alloy filler particles comprise $(Fe_{0.7}Co_{0.3})_{0.95}Ni_{0.05}$.

15. The method of claim 12, wherein the nickel iron alloy filler particles comprise $Ni_{0.81}Fe_{0.19}$.

16. The method of claim 12, wherein at least one of the carrier material of the center layer and the carrier material of one of the pair of exterior layers comprises a polymer resin.

\* \* \* \* \*